US006355873B1

(12) United States Patent
Ishikawa

(10) Patent No.: US 6,355,873 B1
(45) Date of Patent: Mar. 12, 2002

(54) SPHERICAL SHAPED SOLAR CELL FABRICATION AND PANEL ASSEMBLY

(75) Inventor: Akira Ishikawa, Royse, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/599,155

(22) Filed: Jun. 21, 2000

(51) Int. Cl.$^7$ .................... H01L 31/06; H01L 31/072
(52) U.S. Cl. ............... 136/250; 136/244; 136/249; 136/255; 136/261; 136/264; 257/443; 257/459; 257/461; 257/465; 438/63
(58) Field of Search ................ 136/244, 250, 136/249 TJ, 255, 261, 264; 257/443, 459, 461, 465; 438/63

(56) References Cited

U.S. PATENT DOCUMENTS

| | | | |
|---|---|---|---|
| 3,171,068 A | * | 2/1965 | Denkewalter et al. ...... 136/255 |
| 3,172,791 A | * | 3/1965 | Allegretti et al. .......... 136/255 |
| 3,998,659 A | | 12/1976 | Wakefield |
| 4,407,320 A | | 10/1983 | Levine ....................... 136/250 |
| RE31,473 E | | 12/1983 | Kilby et al. |
| 4,425,408 A | | 1/1984 | Levine et al. |
| 4,430,150 A | | 2/1984 | Levine et al. |
| 4,451,968 A | | 6/1984 | Jensen et al. |
| 4,521,640 A | | 6/1985 | Levine ....................... 136/250 |
| 4,581,103 A | | 4/1986 | Levine et al. |
| 4,691,076 A | | 9/1987 | Levine et al. ............... 136/250 |
| 4,738,831 A | | 4/1988 | Naumann et al. |
| 4,806,495 A | | 2/1989 | Levine et al. |
| 4,872,607 A | | 10/1989 | Jensen et al. |
| 4,913,744 A | * | 4/1990 | Hoegl et al. ................ 136/244 |
| 4,917,752 A | | 4/1990 | Jensen et al. |
| 4,957,601 A | | 9/1990 | Levine et al. |
| 4,992,138 A | | 2/1991 | Jensen et al. |
| 4,994,878 A | | 2/1991 | Levine et al. |
| 5,012,619 A | | 5/1991 | Knepprath et al. |
| 5,028,546 A | | 7/1991 | Hotchkiss |
| 5,069,740 A | | 12/1991 | Levine et al. |
| 5,192,400 A | | 3/1993 | Parker et al. |

(List continued on next page.)

FOREIGN PATENT DOCUMENTS

| | | |
|---|---|---|
| EP | 0 947 613 A1 | 10/1999 |
| JP | 59-117109 | 7/1984 |
| JP | 8-133899 | 5/1996 |

OTHER PUBLICATIONS

Application No. 09/346,249 filed Jul. 1, 1999, entitled: High Temperature Plasma–Assisted Diffusion by Yanwei Zhang and Changfeng Xia, copy of first page of specification, abstract and figure No. 1 (Attorney Docket No. 22397.74).
Application No. 09/351,202 filed Jul. 7, 1999, entitled: CVD Photo Resist and Deposition by Akira Ishikawa and Tadao Ohkusa, copy of first page of specification, abstract and figure No. 1 (Attorney Docket No. 22397.92).
Patent Abstracts of Japan, abstract for JP 10–33969, 2–1998.

*Primary Examiner*—Alan Diamond
(74) *Attorney, Agent, or Firm*—Haynes and Boone, LLP

(57) ABSTRACT

A spherical shaped solar diode having an n-type substrate surrounded by a p-type layer of semiconductor material is disclosed. In addition, a plurality of hetero-junction super lattice structures are formed surrounding the p-type layer. The plurality of hetero-junction super lattice structures include alternating layers of Si and SeBeTe. The plurality of hetero-junction super lattice structures adapt the diode to convert higher energy light (as compared to 1.1eV light) to electrical energy. The diodes are formed into a solar panel assembly. The panel assembly includes a wire mesh to secure the diodes and electrically contact one electrode of each diode. A dimpled sheet is also used for securing the diodes and electrically contacting the other electrode of each diode. The diodes are positioned adjacent to the dimpled sheet so that when light is applied to the solar panel assembly, the diodes are exposed to the light on a majority of each diode's surface.

14 Claims, 6 Drawing Sheets

U.S. PATENT DOCUMENTS

| | | |
|---|---|---|
| 5,278,097 A | 1/1994 | Hotchkiss et al. |
| 5,419,782 A | 5/1995 | Levine et al. ............... 136/246 |
| 5,437,736 A * | 8/1995 | Cole ........................ 136/259 |
| 5,462,639 A | 10/1995 | Matthews et al. |
| 5,468,304 A | 11/1995 | Hammerbacher .......... 136/246 |
| 5,560,543 A | 10/1996 | Smith et al. |
| 5,902,416 A * | 5/1999 | Kern et al. ................ 136/244 |
| 5,955,776 A | 9/1999 | Ishikawa ..................... 257/618 |
| 6,041,735 A | 3/2000 | Murzin et al. .............. 118/723 |
| 6,055,928 A | 5/2000 | Murzin et al. .............. 118/723 |
| 6,117,772 A | 9/2000 | Murzin et al. .............. 438/681 |
| 6,120,602 A | 9/2000 | Stephens et al. ............ 117/200 |
| 6,204,545 B1 * | 3/2001 | Nakata ....................... 257/459 |
| 6,271,145 B1 * | 8/2001 | Toda ........................... 438/706 |

\* cited by examiner

SPHERICAL SHAPED SOLAR CELL FABRICATION AND PANEL ASSEMBLY

BACKGROUND

The present invention relates generally to semiconductor devices, and more particularly, to a system and method for manufacturing spherical shaped solar cells and arranging the spherical shaped solar shells into a solar panel assembly.

A major obstacle forbidding solar energy from being utilized widely is the high manufacturing and material cost for solar cell devices. Typically, as disclosed in U.S. Pat. No. 4,691,076, manufacturing conventional solar array involves lengthy processing steps such as expensive multi step melting and solidification process. By using spherical shaped solar diodes, solar arrays will be more cost efficient and more widely used.

Spherical shaped solar diodes are relatively known in the art. However, doping a spherical shaped substrate, either with p-type or n-type material, is time consuming since only a slow solid state surface diffusion process is normally used. This prolonged diffusion process adds a significant cost for producing the solar cell diodes, which adds to the overall manufacturing cost. It is desired to provide a relatively quick and inexpensive process for making solar cells.

Further, it is a normal practice in the semiconductor industry to manufacture semiconductor devices through batch processing. The transportation time between process locations tends to introduce additional cost and increase possibility of contamination. In order to achieve overall efficiency, thus reducing the corresponding manufacturing cost, a method for producing solar cell devices through an uninterrupted manufacturing stream line is desired.

Moreover, it is desired that solar cell devices in general, and solar arrays in particular, be extremely efficient. By making the solar arrays as efficient as possible, their overall acceptance will become even greater. Furthermore, the obvious environmental benefits of solar energy are further enhanced by its gain in popular use.

Further still, it is desired to improve the overall operation, quality, and reliability of solar cells in general, as well as the overall solar cell panels.

SUMMARY

A technical advance is provided by an improved solar cell and panel assembly. In one embodiment, the solar cell is a spherical shaped solar diode having a first substrate (e.g., n-type) surrounded by a p-type layer of semiconductor material. In addition, a plurality of hetero-junction super lattice structures are formed surrounding the p-type layer. In some embodiments, the plurality of hetero-junction super lattice structures include alternating layers of Si and SeBeTe. The plurality of hetero-junction super lattice structures adapt the diode to convert higher energy light (as compared to 1.1 eV light) to electrical energy.

In some embodiments, the panel assembly includes a plurality of solar devices, such as the spherical shaped solar diode discussed above. A wire mesh is used to secure the devices and electrically contact one electrode of each device. A dimpled sheet is also used for securing the devices and electrically contacting the other electrode of each device. The devices are positioned adjacent to the dimpled sheet so that when light is applied to the solar panel assembly, the diodes are exposed to the light on a majority of each diode's surface.

The dimpled sheet may include a plurality of concave dimples, one for each diode. Each concave dimple can individually reflect light to the corresponding diode. Each concave dimple may also include a support structure for positioning each corresponding diode in a central interior portion of the concave dimple. In some embodiments, the concave dimples are formed to protect the corresponding diode from external forces. Also in some embodiments, each concave dimple includes an aperture through which a fluid may flow.

In some embodiments, the dimpled sheet includes a plurality of support dimples for strengthening and supporting the assembly. Each support dimple may also include an aperture through which a fluid may flow.

As a result, a highly efficient solar cell device and solar panel assembly is created. In addition, the manufacturing process to create the solar cell device and/or the solar panel assembly is relatively straightforward and inexpensive.

DESCRIPTION OF THE PREFERRED EMBODIMENT

The following disclosure provides many different embodiments, or examples, for implementing different features of the invention. In general, the disclosure can be separated into two sections: spherical shaped solar cell devices and solar panel assemblies. Techniques and requirements that are only specific to certain sections and/or embodiments should not be imported into other embodiments. Also, specific examples of chemicals, components, and processes are described below to help clarify the invention. These are, of course, merely examples and are not intended to limit the invention from that described in the claims.

Spherical Shaped Solar Cell Devices

Figure 1:
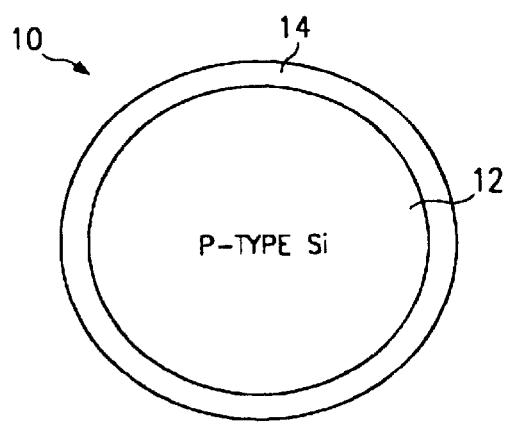
FIG. 1 illustrates one embodiment of a solar device for use in the present disclosure.

Referring now to FIG. 1, one embodiment of a spherical shaped solar cell (photovoltaic) device is designated generally with the reference numeral 10. The device 10 includes a p-type silicon single crystal substrate 12 onto which an n-type silicon layer 14 is applied. The fabrication of the p-n junction is key to successful operation of the device 10. Although photovoltaic technologists may use many other varieties of semiconductors, crystalline-silicon concepts represent a typical application for the present disclosure.

Figure 2A:
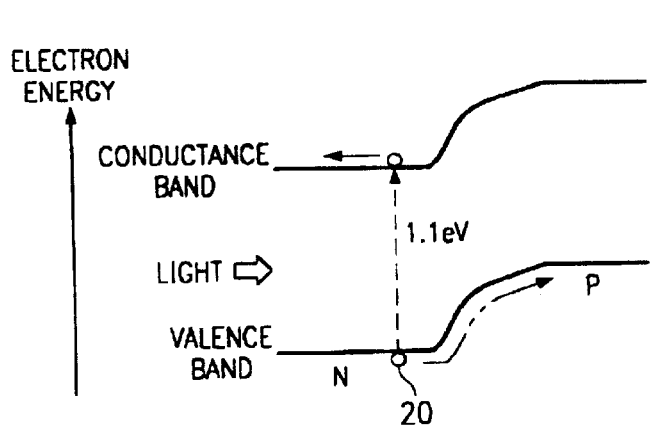
FIGS. 2a, 2b are graphs of electrical operation of the solar device of FIG. 1.
Figure 2B:
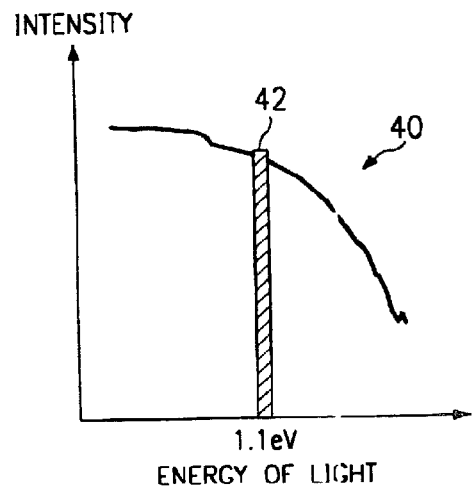

Referring also to FIGS. 2a and 2b, silicon has two distinct energy bands: a lower, valence band and an upper, conduction band. The valence band has available energy states and valence electrons (e.g., an electron 20) and is therefore filled. As shorter wave length light is applied to the device 10, energy is transferred to the valence electrons 20, making it statistically probable that a certain number of the electrons will be raised in energy to such an extent that they are free to conduct electrical charge in the conduction band.

FIG. 2b provides a graph 40 of light energy (measured in wavelength) compared to light intensity. Typically, the device 10 can convert about 1.1 eV of light energy into electricity, at a relatively small wavelength band 42 of light energy.

Figure 3:
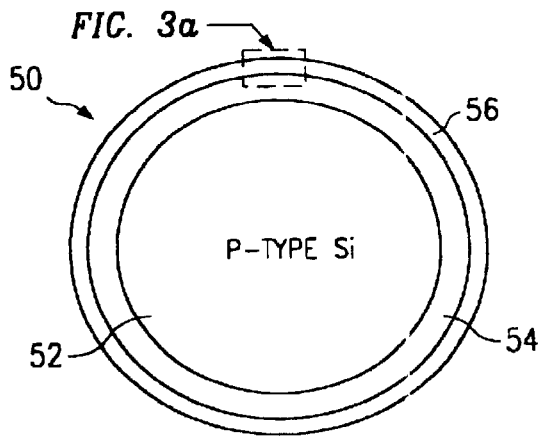
FIGS. 3, 3a illustrate another embodiment of a solar device for use in the present disclosure.
Figure 3A:
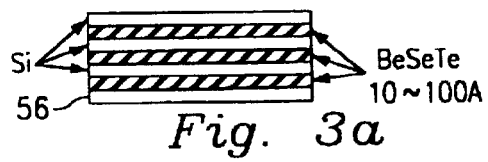

Referring now to FIG. 3, another embodiment of a spherical shaped solar cell device is designated generally with the reference numeral 50. The device 50 includes a p-type silicon single crystal substrate 52 onto which an n-type silicon layer 54 is applied. A plurality of heterojunction super lattice structures 56 are then formed on the surface of the n-layer 54. As shown in blowout FIG. 3a, the hetero-junction super lattice structures 56, in the present embodiment, include a plurality of interchangeable layers of silicon (Si) and beryllium-selenium-tellurium (BeSeTe). The structures 56 are very high quality, having a matched lattice constant and a low interface state density hetero junction between the BeSeTe and the Si. The BeSeTe layer is relatively inexpensive, as compared to conventional II–V compound semiconductors due, in part, to the improved process discussed below. In a preferred embodiment, the BeSeTe is at a ratio of 1:0.55:0.45, although other ratios can be used. Source material for the BeSeTe layers may include:

$BeH_2$, $Be(CH_3)_2$, $Be(C_2H_5)_2$, etc.

$SeH_2$, $Se(CH_3)_2$, $Se(C_2H_5)_2$, etc.

$TeH_2$, $Te(CH_3)_2$, $Te(C_2H_5)_2$, etc.

Source material for the Si layers may include:

$SiH_4$, $Si_2H_6$, etc.

Figure 4A:
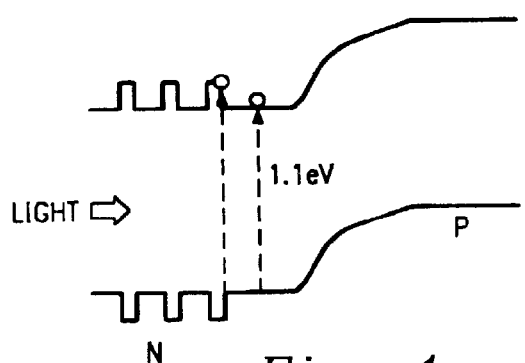
FIGS. 4a, 4b are graphs of electrical operation of the solar device of FIG. 3.
Figure 4B:
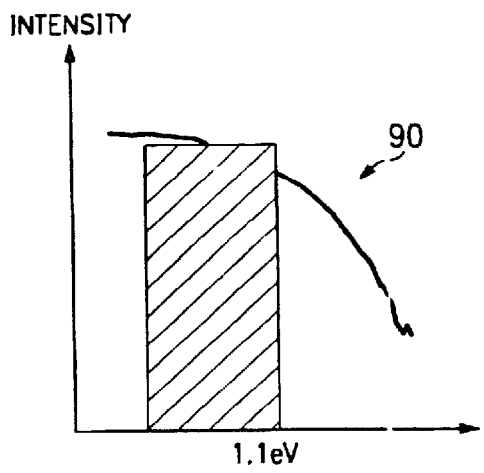

Referring also to FIGS. 4a and 4b, the device 50 has the same two energy bands: the valence band and the conduction band, although the shape of these bands are slightly modified by the structures 56. FIG. 4b provides another graph 90 of light energy (measured in wavelength) compared to light intensity. Typically, the device 10 can mostly convert about 1.1 eV of light energy into electricity, at a relatively large wavelength band 92 of light energy.

As a result, the device 50 can convert higher energy light as well as 1.1 eV light. In addition, the BeSeTe layer enables a lattice matched hetero junction by selecting an appropriate ratio of Se and Te.

Referring now to FIG. 5, the hetero-junction super lattice structures 56 can be manufactured by a series of free fall chemical vapor deposition (CVD) processing tubes 100, 102, 104. These tubes are similar to those described in U.S. Pat. No. 5,955,776, which is hereby incorporated by reference, with changes discussed in greater detail below. In addition, technology described in U.S. Pat. No. 6,053,123, which is also hereby incorporated by reference, may also be implemented in some embodiments.

Each of the processing tubes 100–104 is similarly constructed, with parameters and environments adapted for a particular CVD operation. In the present example, the processing tubes 100, 104 are used for applying BeSeTe through CVD, and tube 102 is used for applying Si through CVD. In some embodiments, there are many more processing tubes for applying additional layers of BeSeTe and/or Si onto the device 50. It is understood that in the present discussion, the device 50 is being fabricated, and therefore at different times may not yet have all the layers and attributes discussed above with reference to FIG. 3.

Each processing tube 100–104 includes a receiver 110 for connecting to a transfer tube 112. The transfer tube 112 provides the spherical shaped devices 50 from previous operations.

Figure 5A:
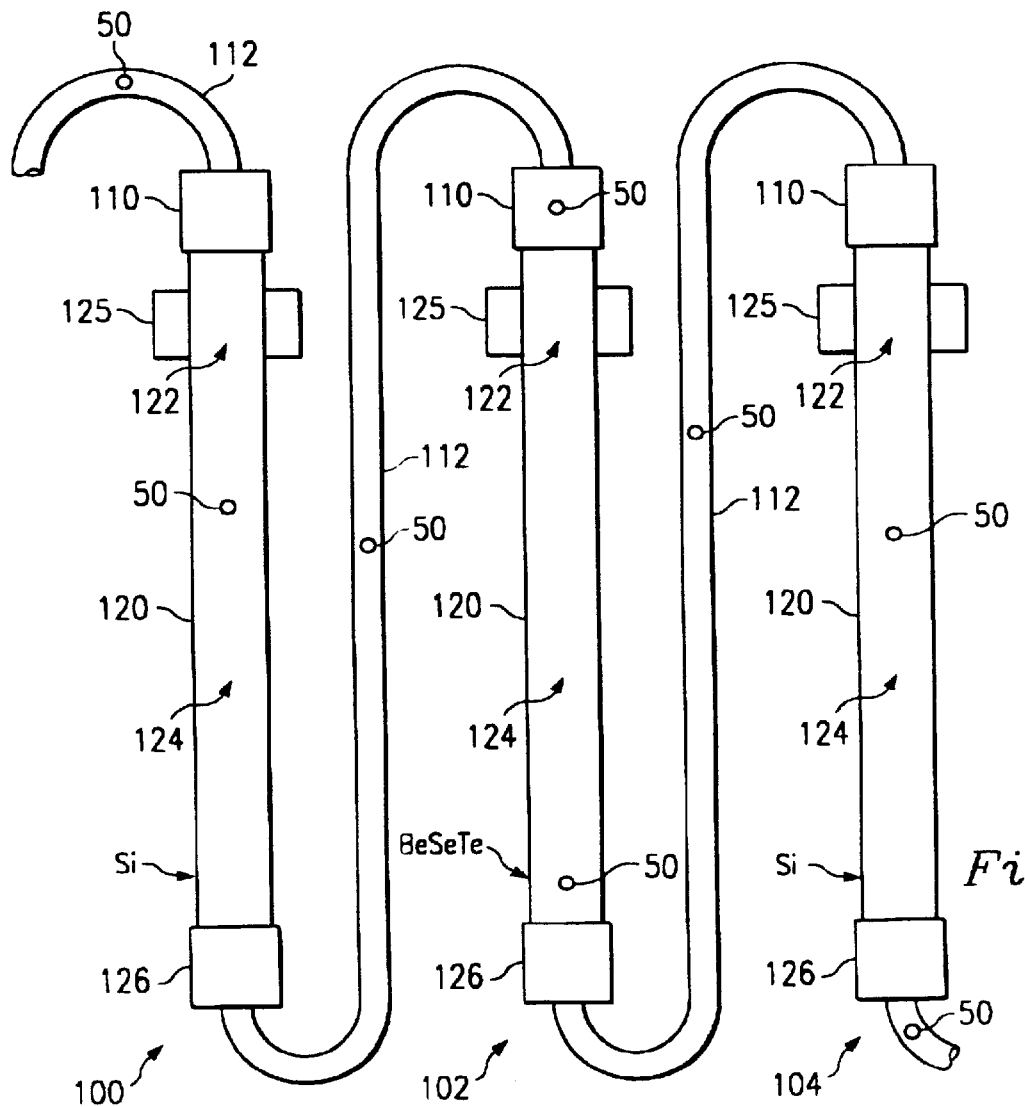
FIGS. 5a, 5b are drawings of processing systems for manufacturing the device of FIG. 3.
Figure 5B:
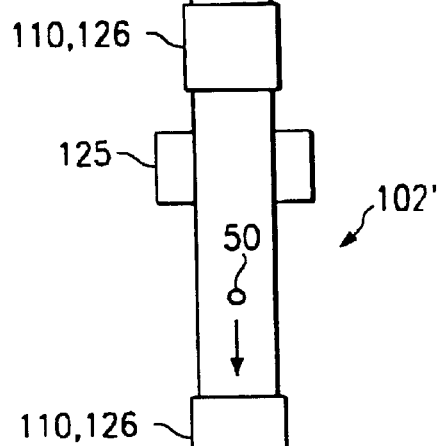

Referring to FIG. 5b, the transfer tube 112 may represent many different transfer mechanisms, including a batch type carrying system. In some embodiments, no transfer tubes may be used. For example, the processing tubes (designated 100', 102', 104') are directly connected to each other and the devices 50 may simply drop or float from one tube to the next.

Referring to FIGS. 5a and 5b, the receiver 110 provides the sequence of devices 50 into a processing chamber 120. The processing chamber includes a vaporized interior of the material being processed (Si or BeSeTe). The processing chamber 120 includes a first heated portion 122 and a second cooling portion 124. The heated portion 122 may be heated by an electrical heater, a plasma flame, or any other suitable heating system, represented generally with the reference numeral 125. In one embodiment, a temperature of the heated portion 122 exceeds the melting point of the device 50. Further connected to the cooling portion 124 is a receiver 126 for receiving the device 50 after successful CVD.

In operation, a sequence of the devices 50 move through the receiver 110 and into the heated portion 122 of the chamber 120. The heating system 125 heats and starts to melt the devices 50. Since the devices 50 are moving through the heated portion 122, they do not completely melt. The vaporized material inside the chamber 120 deposits onto the devices 50 and solidifies, as the devices move through the cooling portion 124. The devices 50 are then received in the receiver 126, where they may now proceed to the next processing tube, as required.

Once completed, the devices can be further processed to provide electrodes to both the p-type material and the n-type material. Examples of this further processing are discussed in the following section.

An advantage of the above process is that many spherical solar cells can be rapidly and continually processed in a sequential manner.

Solar Panel Assembly

Referring now to FIGS. 6, 7a, 7b, and 7c, one or more of the solar devices, such as the spherical shaped solar diodes 10 and 50 of FIGS. 1 and 3, respectively, can be formed into a solar panel assembly 200. The assembly 200 includes a conductive wire mesh portion 210 for securing and electrically contacting the solar devices (e.g., diodes 50). In one embodiment, the mesh 210 is a woven pattern of electrical conductors. The mesh 210 is itself relatively stiff, and the open portions are slightly smaller than the diameter of the diodes 50, so that when the diodes are pressed into the mesh, the mesh and diodes are relatively secured together. This eliminates the need for any external adhesive, such as solder or epoxy, although such adhesive can be used.

In addition to the mesh 210 and the diodes 50, the assembly 200 also includes a dimpled sheet 220. In one embodiment, the dimpled sheet is formed of aluminum foil, although other embodiments are anticipated. Aluminum foil is desirable because of its ability to reflect sunlight, discussed in greater detail below. The mesh 210 and diodes 50 are positioned with the sheet 220 so that there exists a first electrical contract between the mesh and one electrode of the diodes, and a second electrical contact between another electrode of the diodes and the sheet. It is desired that the mesh 210 and the sheet 220 are maintained in electrical isolation from each other, except through the diodes 50.

In operation, sunlight or other energy is provided to the diodes 50. The diodes convert the energy to electrical energy, which is provided to the mesh 210 and the sheet 220. Therefore, the mesh 210 and the sheet 220 act as electrodes for the entire assembly 200.

Figure 7A:
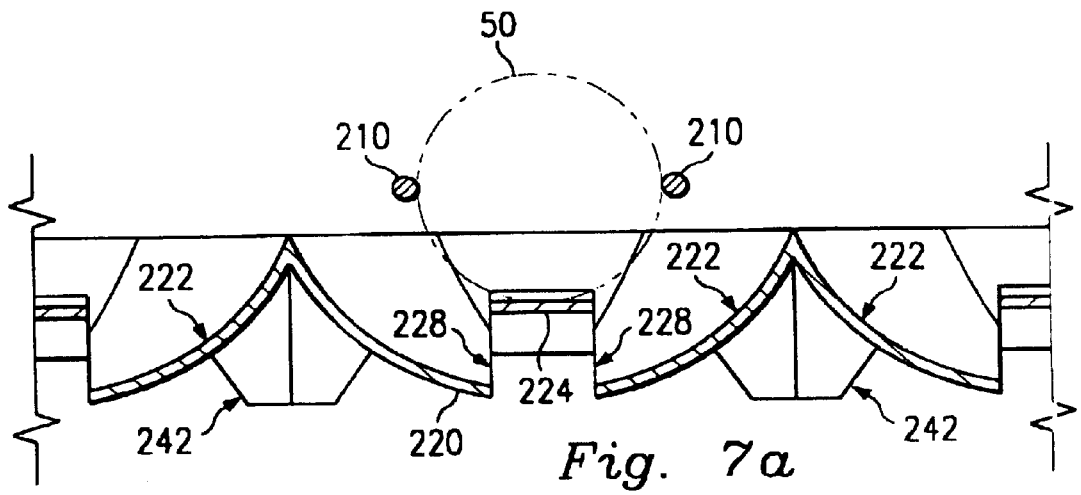
FIGS. 7a, 7b, 7c are angular views of the assembly of FIG. 6.
Figure 7B:
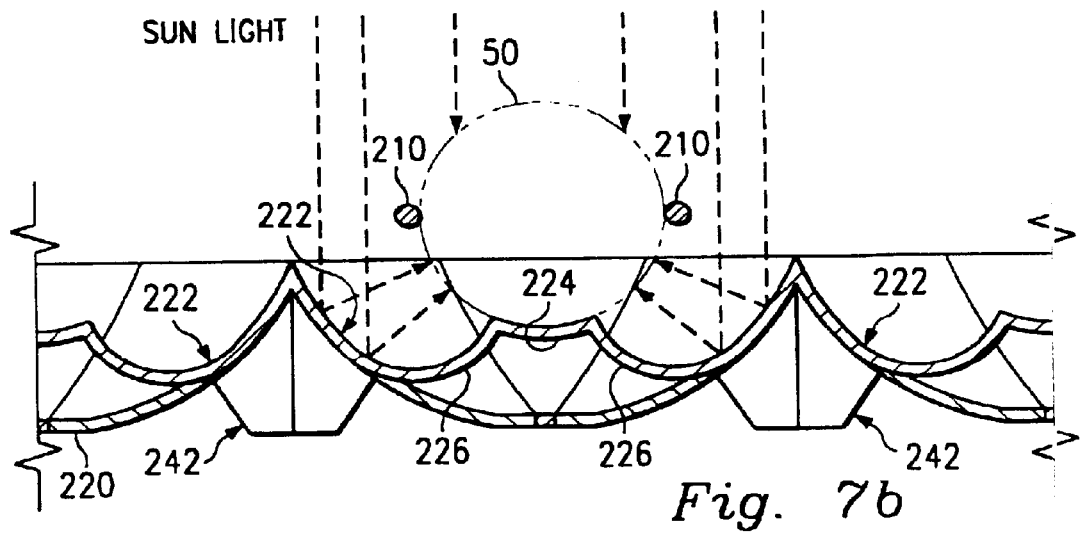

Referring specifically to FIGS. 7a and 7b, as stated above, the sheet 220 is dimpled. The dimples can perform several functions according to different embodiments. In one embodiment, a concave dimple 222 is formed as a semicircle to perform various functions. First of all, the concave dimple 222 allows one or more diodes 50 (one diode is illustrated) to be positioned "inside" the sheet 220. By being inside the sheet, the diode is protected from various external forces. In addition, the concave dimple 222 serves to direct sunlight (or other energy) towards the diode 50. As a result, sunlight can be applied to a majority of the diode's surface.

Positioned within the concave dimple 222 is a support structure 224. In the present embodiment, the support structure 224 is connected to the concave dimple 222 through one or more legs 226. The support structure 224 thereby centers the diode 50 in the concave dimple 222, which allows even more sunlight to contact the diode's surface. The legs 226 also define an aperture 228 through which a fluid (e.g., rain water) and/or debris may flow. An advantage is provided by maximizing the reflected energy by removing fluid and/or debris.

Figure 7C:
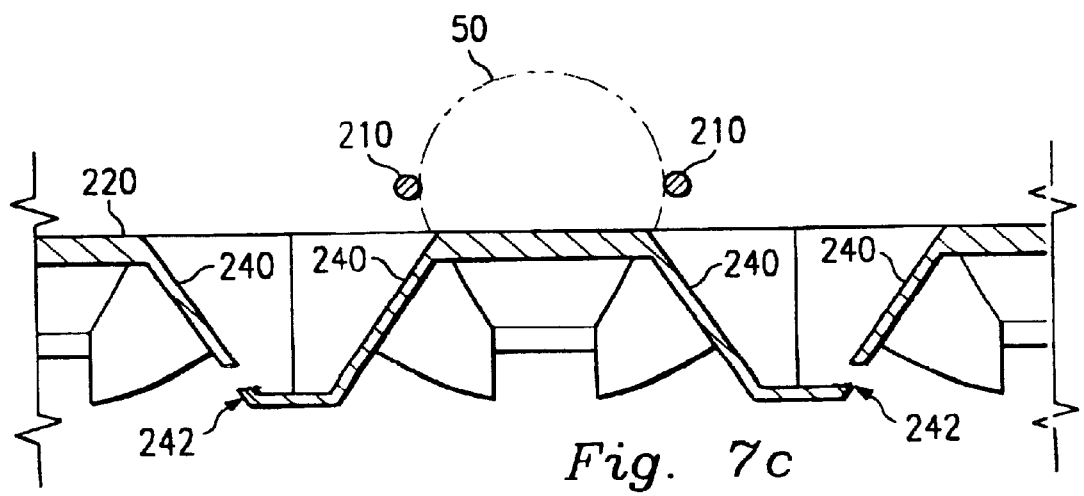

Referring specifically to FIG. 7c, in one embodiment, a plurality of support dimples 240 can be used to support the sheet 220 and to provide extra rigidity. In the present embodiments, the support dimples 240 are positioned between the various concave dimples 222, but are not present along the outermost edges of the sheet 220. In other embodiments, different arrangements of the support dimples 240 can be provided, including placing the dimples on the outermost edges of the sheet 220, to accommodate different desired applications. In some embodiments, the support dimples 240 include a plurality of apertures 242 through which a fluid (e.g., rain water) and/or debris may flow.

Figure 8A:
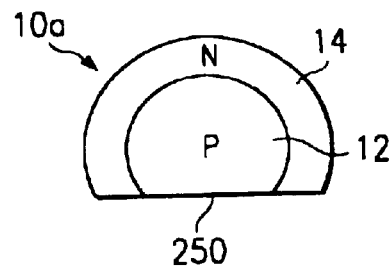
FIGS. 8a, 8b, 8c are diagrams of how a solar diode is mounted onto a portion of the assembly of FIG. 6.
Figure 8B:
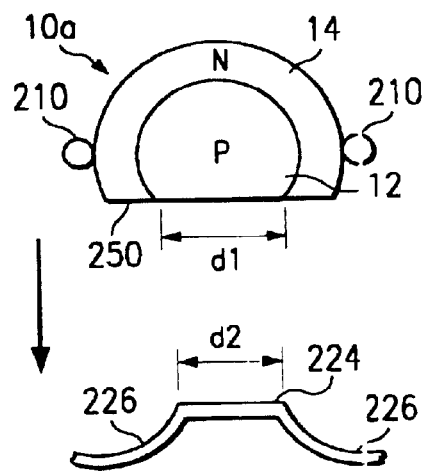
Figure 8C:
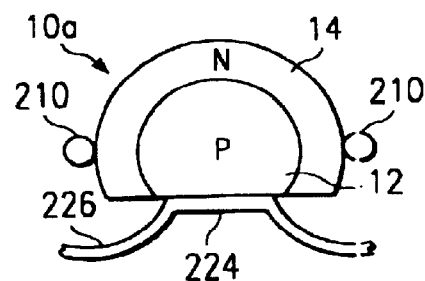
Figure 6:
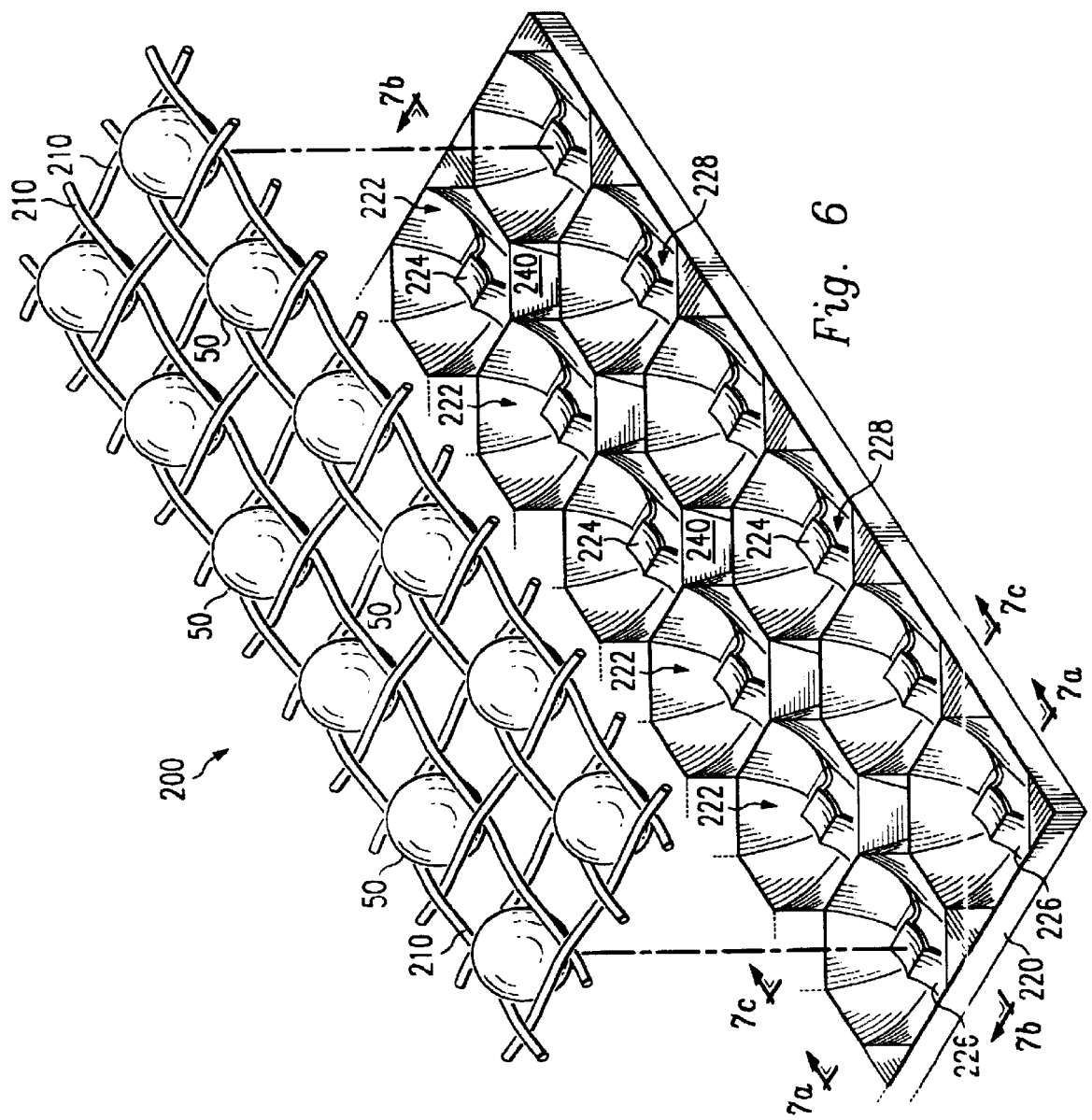
FIG. 6 is a perspective view of a solar panel assembly according to one embodiment of the present disclosure.

Referring to FIGS. 8a–8c, the solar panel assembly 200 can be constructed in different ways, using one or more of the processes discussed below. The following processes are discussed with reference to the spherical shaped solar diode 10 of FIG. 1. It is understood, however, that the diode 50 of FIG. 3 or any other solar detector device may be used, with adjustments made to accommodate the different device.

Referring specifically to FIG. 8a, the diode 10 is processed to reveal a portion of the p-type material 12 to an exterior contact. In one embodiment, the processing may be in the form of a polishing operation, producing a flat surface 250, as shown.

Referring specifically to FIG. 8b, the exposed portion of the p-type material 12 is illustrated having a width (diameter) of d1. The support structure 224 of the sheet 220 is illustrated having a width of d2. In the present embodiment:

$$d2<d1.$$

In some embodiments, the support structure may be relatively large, and have a special contact portion for electrically connecting to the diode 10.

Referring specifically to FIG. 8c, as a result, the diode 10 can rest on the support structure 224 so that the support structure only contacts the p-type material 12. Since the support structure 224 is relatively small, it does not electrically contact the n-type material 14.

Figure 9:
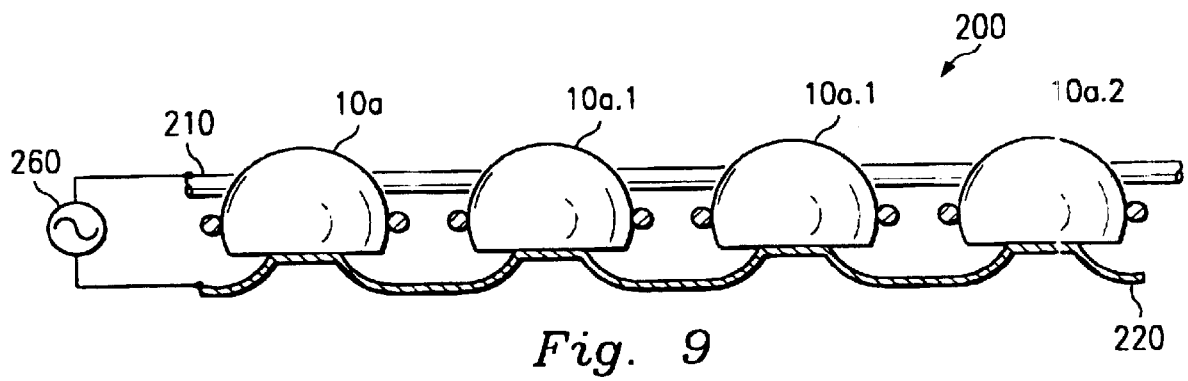
FIGS. 9–11 illustrate how the solar panel assembly of FIG. 6 can be tested.
Figure 10:
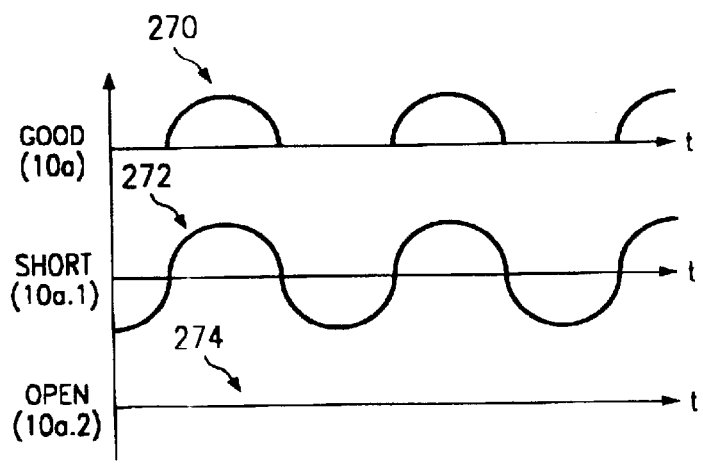
Figure 11:
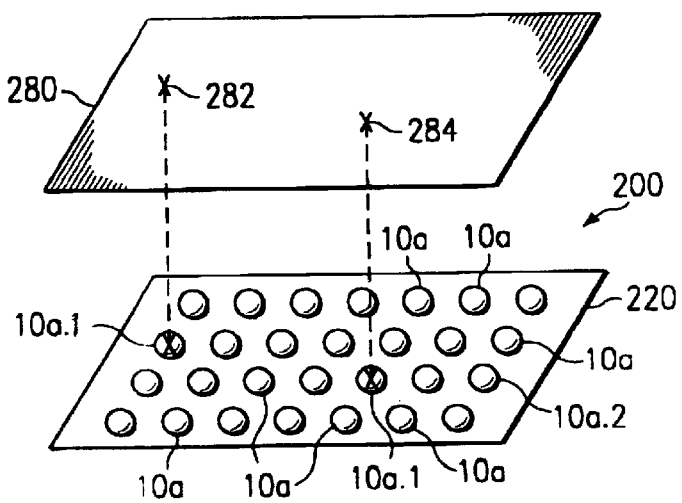

Referring to FIGS. 9–11, it may be desirable to locate and isolate bad detectors in the solar panel assembly 200. In the present example, a bad detector is a diode that is electrically shorted. The shorts may be a result of various problems, such as poor construction of the diode itself, or improper mounting of the diode to the support structure 224. Electrically shorted diodes are harmful because they draw an excessive amount of current and may cause various electrical problems, which are well understood by those of ordinary skill in the art. While electrically open diodes are not operational and therefore do not provide solar power, individually they do not harm or otherwise damage the solar panel assembly 200.

Referring specifically to FIG. 9, one way to locate an electrically shorted diode is to provide an alternating current (AC) power supply 260 to the solar panel assembly 200. The AC power supply 260 connects to the sheet 220 and the mesh 210. For the sake of example, the solar panel assembly 200 includes a plurality of the diodes 10a, of which four are illustrated. All of the "good" diodes (properly operational) are labeled with the reference numeral 10a, the shorted diodes are labeled with the reference numeral 10a.1, and the open diodes are labeled with the reference numeral 10a.2.

Referring also to FIG. 10, as the AC power supply 260 provides an alternating current cycle to the diodes, the good diodes 10a perform differently from the bad diodes 10a.1, 10a.2. The good diodes 10a perform as indicated by graph 270, in that they are conducting for half of the cycle, and appear as open circuits during the other half. The shorted diodes 10a.1 perform as indicated by graph 272, in that they are conducting for the entire cycle. The open diodes 10a.2 perform as indicated by graph 274, in that they are not conducting for the entire cycle. It is well understood in the art that the shorted diodes 10a.1 will produce significantly more (e.g., twice as much) heat as the good diodes 10a, and the open diodes 10a.2 will produce almost no heat.

Referring now to FIG. 11, a thermal device 280 can be placed near the assembly 200 to detect one or more "hot spots." The hot spots identify where the shorted diodes 10a.1 are located. In the present example, there are two shorted diodes 10a.1 interspersed among the other diodes 10a and 10a.2 on the assembly 200. Two hot spots 282, 284 are detected by the thermal device 280, accordingly. It is understood that in the present embodiment, the two hot spots 282, 284 are simultaneously detected. However, in other embodiments, the assembly 200 may be larger than the thermal device 280, so that one is moved relative to the other to detect all of the hot spots.

Once the hot spots 282, 284 are detected, the shorted diodes 10a.1 can be readily identified and disabled. Additional tests can be performed on the assembly to determine if an acceptable number of good diodes 10a are present in the assembly, or for other functional requirements.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A non-planar solar diode comprising:
    a first substrate of a first material being of either n-type or p-type conductivity;
    a second layer of a second material being of a different type conductivity than the first material, the second layer surrounding the first layer; and
    a plurality of hetero-junction super lattice structures surrounding the second layer and including alternating layers of Si and SeBeTe.

2. The diode of claim 1 wherein an elemental ratio of SeBeTe is 1:0.55:0.45.

3. A solar panel assembly comprising:
   a plurality of solar devices, each device having two electrodes;
   a wire mesh for securing the devices and electrically contacting one electrode of each device;
   a dimpled sheet for securing the devices and electrically contacting the other electrode of each device;
   wherein, the devices are positioned adjacent to the dimpled sheet so that when light is applied to the solar panel assembly, the devices are exposed to the light on a majority of each device's surface.

4. The solar panel assembly of claim 3 wherein the dimpled sheet includes a plurality of concave dimples, one for each device, each concave dimple for individually reflecting light to the corresponding device.

5. The solar panel assembly of claim 4 wherein the concave dimples are also formed to protect the corresponding device from external forces.

6. The solar panel assembly of claim 4 wherein each concave dimple includes a support structure for positioning each corresponding device in a central interior portion of the concave dimple.

7. The solar panel assembly of claim 6 wherein each device is mostly spherical in shape, with an outer portion for providing one electrode and an exposed inner portion for providing another electrode having a first width $d1$, and wherein each support structure has a second width $d2$ such that $d1>d2$.

8. The solar panel assembly of claim 4 wherein each concave dimple includes an aperture through which a fluid may flow.

9. The solar panel assembly of claim 3 wherein the dimpled sheet includes a plurality of support dimples for strengthening and supporting the assembly.

10. The solar panel assembly of claim 9 wherein each support dimple includes an aperture through which a fluid may flow.

11. The solar panel assembly of claim 3 wherein the solar devices are spherical shaped diodes, each diode comprising:
    a first substrate of a first material being of either n-type or p-type conductivity;
    a second layer of a second material being of a different type conductivity than the first material, the second layer surrounding the first layer; and
    a plurality of hetero-junction super lattice structures surrounding the second layer.

12. The solar panel assembly of claim 11 wherein the plurality of hetero-junction super lattice structures includes alternating layers of Si and SeBeTe.

13. A non-planar solar diode comprising:
    a spherical shaped substrate of a first material being of a first conductivity type;
    a layer of a second material being of a second conductivity type, the second conductivity type being different from the first conductivity type, the layer surrounding the spherical shaped substrate; and
    a plurality of hetero-junction super lattice structures surrounding the second layer.

14. The diode of claim 13 wherein a relatively small portion of the first material is not covered by the second material.

* * * * *